US010186812B1

(12) United States Patent
Folker et al.

(10) Patent No.: US 10,186,812 B1
(45) Date of Patent: Jan. 22, 2019

(54) FERRITE WAFER AND CONNECTOR ASSEMBLY FOR EMI NOISE SUPPRESSION ON A PRINTED CIRCUIT BOARD

(71) Applicant: Universal Lighting Technologies, Inc., Madison, AL (US)

(72) Inventors: Donald Folker, Madison, AL (US); Wei Xiong, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 0 days.

(21) Appl. No.: 15/962,312

(22) Filed: Apr. 25, 2018

Related U.S. Application Data

(60) Provisional application No. 62/491,495, filed on Apr. 28, 2017.

(51) Int. Cl.
*H01R 12/00* (2006.01)
*H01R 13/6594* (2011.01)
*H01R 13/6581* (2011.01)
*H01R 12/57* (2011.01)
*H05K 1/02* (2006.01)
*H01R 12/71* (2011.01)
*H01R 12/70* (2011.01)
*H01R 12/58* (2011.01)

(52) U.S. Cl.
CPC ......... *H01R 13/6594* (2013.01); *H01R 12/57* (2013.01); *H01R 12/58* (2013.01); *H01R 12/7088* (2013.01); *H01R 12/716* (2013.01); *H01R 13/6581* (2013.01); *H05K 1/0233* (2013.01)

(58) Field of Classification Search
CPC .... H01R 13/6594; H01R 12/57; H01R 12/58; H01R 12/7088; H01R 12/716; H01R 13/6581; H05K 1/023; H05K 1/0233
USPC ........................................ 439/55, 7, 620.018
See application file for complete search history.

(56) References Cited

U.S. PATENT DOCUMENTS

| 5,461,351 | A | 10/1995 | Shusterman |
| 6,125,044 | A | 9/2000 | Cherniski et al. |
| 6,276,943 | B1 | 8/2001 | Boutros et al. |
| 6,848,943 | B2 | 2/2005 | Machado et al. |

(Continued)

*Primary Examiner* — Khiem Nguyen
(74) *Attorney, Agent, or Firm* — Patterson Intellectual Property Law, P.C.; Jerry Turner Sewell; Alex H. Huffstutter

(57) ABSTRACT

A connector assembly suppresses electromagnetic interference (EMI) generated by electronic circuitry on a printed circuit board (PCB). Certain embodiments of the connector assembly include common features such as conductive through-holes on the PCB, and a connector having terminal pins positionable through the conductive through-holes. The first embodiment includes a magnetic wafer positionable between the connector and the PCB. The second embodiment includes a plurality of stackable magnetic wafers positionable in a stack between the connector and the PCB. The third embodiment includes a magnetic cup wafer positionable between the connector and the PCB. The fourth embodiment, combines the cup wafer with the stackable magnetic wafers of the second and third embodiments. Each magnetic wafer includes wafer holes for the terminal pins to pass through. The magnetic wafers are configured to increase inductance and provide effective EMI noise suppression.

21 Claims, 19 Drawing Sheets

(56) References Cited

U.S. PATENT DOCUMENTS 6,867,362 B2    3/2005  Cherniski et al.
7,841,902 B2 * 11/2010 Chow ................ H01R 13/6633
                                                439/620.15
8,152,567 B2 *  4/2012  Wu .................... H01R 13/6633
                                                439/620.06

* cited by examiner

US 10,186,812 B1

FERRITE WAFER AND CONNECTOR ASSEMBLY FOR EMI NOISE SUPPRESSION ON A PRINTED CIRCUIT BOARD

CROSS-REFERENCES TO RELATED APPLICATIONS

This application claims benefit of the following patent application which is hereby incorporated by reference: U.S. Provisional Patent Application No. 62/491,495 filed Apr. 28, 2017 entitled "Ferrite Wafer and Connector for EMI Noise Suppression on a Printed Circuit Board."

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

FIELD OF THE INVENTION

The present disclosure generally relates to electromagnetic (EMI) suppression. More particularly, the present disclosure relates to EMI suppression at a connector of a printed circuit board (PCB).

BACKGROUND OF THE INVENTION

Power converter systems (e.g., AC-DC converters or AC-AC converters) are regulated by the Federal Communications Commission (FCC) with regard to radio emission produced. The FCC standards are typically met by using radio frequency (RF) beads to suppress EMI as shown in FIG. 1, which illustrates a conventional power converter system 100. The power converter system 100 includes one or more of an input connector 102, an output connector 104, and a power processing module 106. The input connector 102 is coupled to an external alternating current voltage source 108. The output connector is coupled to an external load 110. The external load 110 receives a direct current (DC) voltage from the power processing module 106. The input connector 102, the output connector 104, and the power processing module 106 are positioned on a printed circuit board (PCB) 112.

The power converter system 100 includes a first RF bead 114 and a second RF bead 116. Each of the first and second RF beads 114, 116 is coupled onto a respective lead line between the input connector 102 and the power processing module 106. Each of the first and second RF beads 114, 116 is located at the immediate input of the power processing module 106. The power converter system 100 further includes a third RF bead 118 and a fourth RF bead 120. Each of the third and fourth RF beads 118, 120 is coupled to a respective lead line between the power processing module 106 and the output connector 104. The third and fourth RF beads 118, 120 are positioned at or near the immediate output of the power processing module 106. The first, second, third, and fourth RF beads 114, 116, 118, 120 are used to suppress emission of high frequency noise (e.g., in a range of 30 MHz-300 MHz) out of the power converter system 100. RF beads 114, 116, 118, 120 enable the power converter system 100 to pass FCC RF emission tests.

RF beads are typically very costly, require excessive area on the PCB, dissipate power, and negatively affect system efficiency. Other known RF suppression devices (e.g., drum core inductors, ferrite toroids, and the like) have similar issues.

BRIEF SUMMARY OF THE INVENTION

Accordingly, a need exists for an EMI suppression assembly that eliminates the use of RF beads on PCBs. The EMI suppression assembly disclosed herein is more efficient, cost effective and better suited for assembly line construction than magnetic components such as drum cores, RF beads, ferrite toroids, or the like. The disclosed assembly integrates EMI noise suppression with the connector in order minimize the space devoted to RF beads on PCBs.

In one embodiment, a connector assembly is provided for suppressing electromagnetic interference (EMI) generated by electronic circuitry on a printed circuit board (PCB). The connector assembly includes a plurality of conductive through-holes, a connector, and a magnetic wafer cup. The plurality of conductive through-holes form a conductive through-hole pattern on the PCB. The conductive through-holes are electrically connected to the electronic circuitry on the PCB. The connector has an outer perimeter wall, a lower connector surface, and a connector height extending vertically from the lower connector surface. The connector includes a plurality of terminal pins, which are configured to form a pin pattern. The pin pattern conforms to the conductive through-hole pattern of the conductive through-holes on the PCB. The terminal pins are configured to engage the conductive through-holes. The magnetic wafer cup is coupleable between the PCB and the lower connector surface. The magnetic wafer cup has a main wafer body, an upper wafer surface, a lower wafer surface, and contiguous walls extending vertically from the main wafer body. The vertical walls surround the upper wafer surface. The main wafer body has a plurality of wafer holes configured to align with both the terminal pins and the conductive through-holes. The lower wafer surface is configured to contact the PCB. The upper wafer surface is configured to contact the lower connector surface. The contiguous walls are configured to surround the outer perimeter wall of the connector by a vertical portion of the connector height.

In certain embodiments, the connector includes a plurality of conductors attached in electrical communication with the terminal pins.

In certain embodiments, the contiguous walls of the wafer cup include internal wall surfaces configured to contact the outer perimeter walls of the connector. The internal wall surfaces of the wafer cup have an internal wall height. The portion of the connector height is equal to the internal wall height. The internal wall height is less than the connector height.

In certain embodiments, both the connector and the main wafer body are rectangular shaped.

In certain embodiments, the connector has a connector profile defined by the lower connector surface, and the main wafer body has a wafer profile matching the connector profile. The contiguous walls in combination with the upper wafer surface define a cavity having a cavity profile matching the connector profile.

In certain embodiments, the contiguous walls align the terminal pins of the connector with the wafer holes of magnetic wafer cup.

Another embodiment disclosed herein is a printed circuit board (PCB) connector assembly for suppressing electromagnetic interference (EMI) generated by electronic circuitry on the PCB. The PCB connector assembly includes a plurality of conductive PCB through-holes, a plurality of non-conductive PCB through-holes, a connector, and a magnetic wafer. The conductive and non-conductive PCB through-holes are formed on the PCB. The connector has a plurality of terminal leads extending from a bottom connector surface. The terminal leads are positionable through the plurality of conductive PCB through-holes. The connector when coupled to a plurality of conductors is in electrical communication with the terminal pins. The magnetic wafer includes an upper wafer surface, a lower wafer surface and a plurality of wafer through-holes extending between the upper and lower wafer surfaces. The magnetic wafer is positionable between the PCB and the lower surface of the connector. The magnetic wafer further includes a plurality of wafer legs extending from the lower wafer surface. The wafer legs are configured to engage the non-conductive PCB through-holes.

In certain embodiments, each wafer leg has a square leg profile and each non-conductive PCB through-hole is square.

In certain embodiments, the magnetic wafer is square with four corners, and the wafer legs include four legs with one leg positioned at each of the four corners.

In certain embodiments, the wafer legs when engaged with the non-conductive PCB through-holes are configured to align the wafer through-holes with the conductive PCB through-holes.

Another embodiment disclosed herein is a connector assembly for suppressing electromagnetic interference (EMI) from electronic circuitry on a printed circuit board (PCB). The connector assembly includes a plurality of conductive through-holes, a connector, and a plurality of stackable magnetic wafers. The conductive through-holes are formed on the PCB and are electronically connected to the electronic circuitry. The connector has a plurality of terminal pins extending perpendicularly therefrom. The terminal pins are configured to pass through the conductive through-holes and to electrically engage with the conductive through-holes, thereby forming an electrically connection to the electronic circuitry. Each of the stackable magnetic wafers has a lower wafer surface, an upper wafer surface, a plurality of wafer through-holes, at least one wafer leg extending from the lower wafer surface, and at least one wafer leg cut-out extending between the lower wafer surface and the upper wafer surface. For example, a stack is formed by the at least one wafer leg of a second wafer engaging the at least one wafer leg cutout of an adjacent first wafer to align the wafer through-holes of the first and second wafers. The terminal pins are configured to extend fully through the aligned wafer through-holes of the first and second wafers and to engage the conductive through-holes of the PCB.

In certain embodiments of the connector assembly, each of the stackable magnetic wafers is generally square having a first corner, a second corner, a third corner, and a forth corner, the first and third corners positioned diagonally opposite. The at least one wafer leg of each stackable magnetic wafer includes a first wafer leg and a second wafer leg. Each of the first and second wafer legs extends from diagonally opposite corners of the wafer. The stackable wafers include stackable wafers having a first wafer configuration and stackable wafers having a second wafer configuration. The stackable wafers are stacked by alternating between the first and the second wafer configurations in order for the wafer through-holes to align. The first wafer configuration includes a first wafer leg and a second wafer leg positioned at the first and third wafer corners, respectively. The first wafer configuration further includes a first wafer leg cut-out and a second wafer leg cut-out positioned at the second and fourth wafer corners, respectively. The second wafer configuration includes a first wafer leg and a second wafer leg positioned at the second and fourth wafer corners, respectively. The second wafer configuration further includes a first wafer leg cut-out and a second wafer leg cut-out positioned at the first and third wafer corners, respectively.

In certain embodiments, the PCB further includes a plurality of square leg through-holes. The at least one wafer leg of the first wafer is configured to engage at least one of the leg through-holes.

In certain embodiments, the stackable wafers further include a third wafer. The third wafer is stacked on top of the second wafer. The second wafer is stacked on top of the first wafer. The at least one wafer leg of the third wafer engages the at least one wafer leg cutout of the second wafer to align the through-holes of the first, second and third wafers.

DETAILED DESCRIPTION OF THE INVENTION

In the following description, various dimensional and orientation words, such as height, width, length, longitudinal, horizontal, vertical, up, down, left, right, tall, low profile, and the like, may be used with respect to the illustrated drawings. Such words are used for ease of description with respect to the particular drawings and are not intended to limit the described embodiments to the orientations shown. It should be understood that the illustrated embodiments can be oriented at various angles and that the dimensional and orientation words should be considered relative to an implied base plane that would rotate with the embodiment to a revised selected orientation.

Reference will now be made in detail to embodiments of the present disclosure, one or more drawings of which are set forth herein. Each drawing is provided by way of explanation of the present disclosure and is not a limitation. It will be apparent to those skilled in the art that various modifications and variations can be made to the teachings of the present disclosure without departing from the scope of the disclosure. For instance, features illustrated or described as part of one embodiment can be used with another embodiment to yield a still further embodiment.

It is intended that the present disclosure covers such modifications and variations as come within the scope of the appended claims and their equivalents. Other objects, features, and aspects of the present disclosure are disclosed in the following detailed description. It is to be understood by one of ordinary skill in the art that the present discussion is a description of exemplary embodiments only and is not intended as limiting the broader aspects of the present disclosure.

Figure 1:
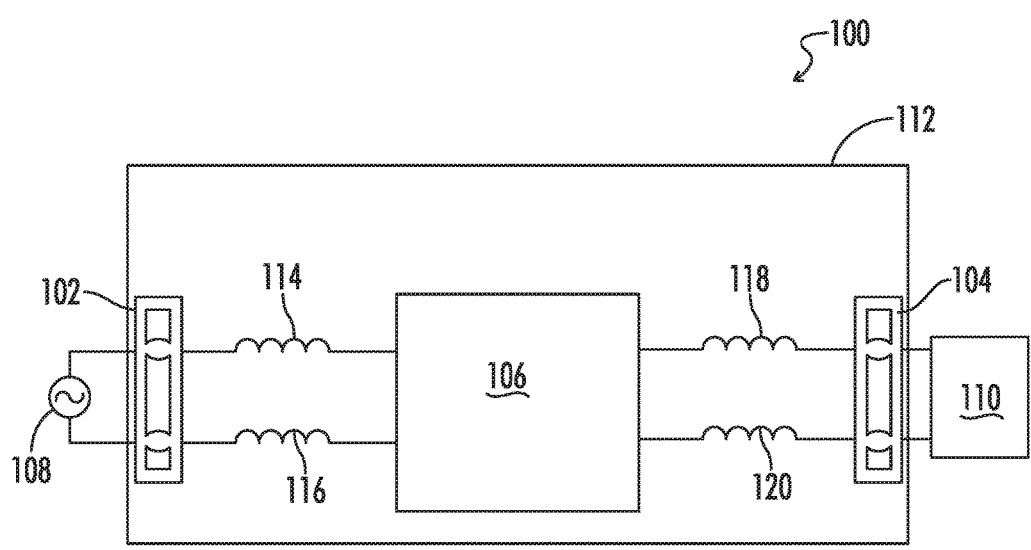
FIG. 1 illustrates a traditional power converter system with radio frequency (RF) beads for RF noise suppression.
Figure 2:
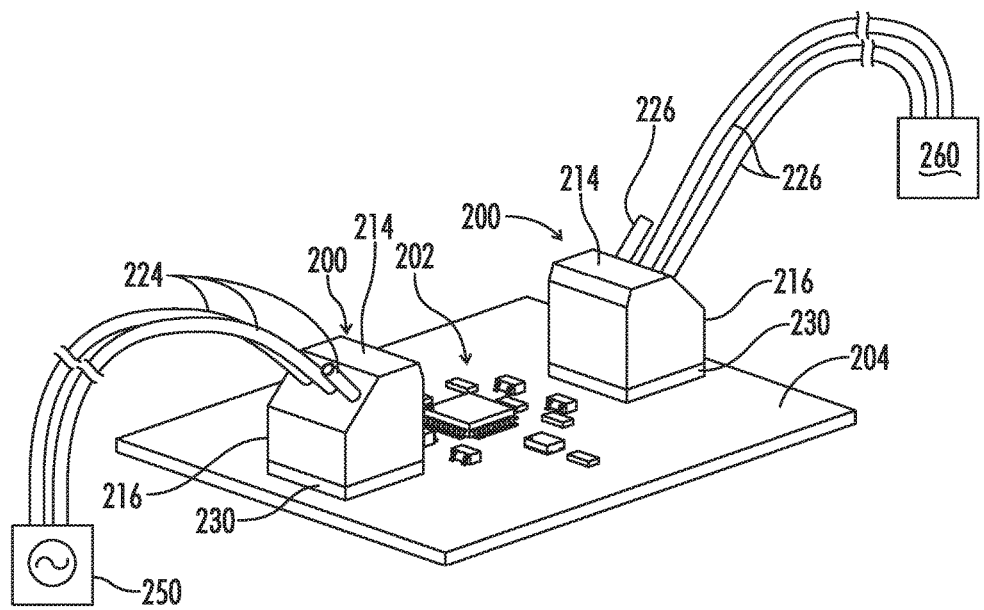
FIG. 2 illustrates a perspective view of a power converter system implementing a connector assembly in accordance with the present disclosure.
Figure 3:
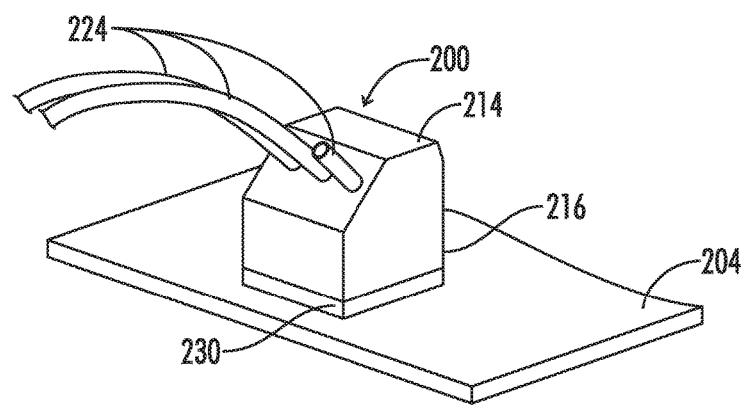
FIG. 3 illustrates a perspective view of a connector assembly having a magnetic wafer in accordance with the present disclosure.
Figure 4:
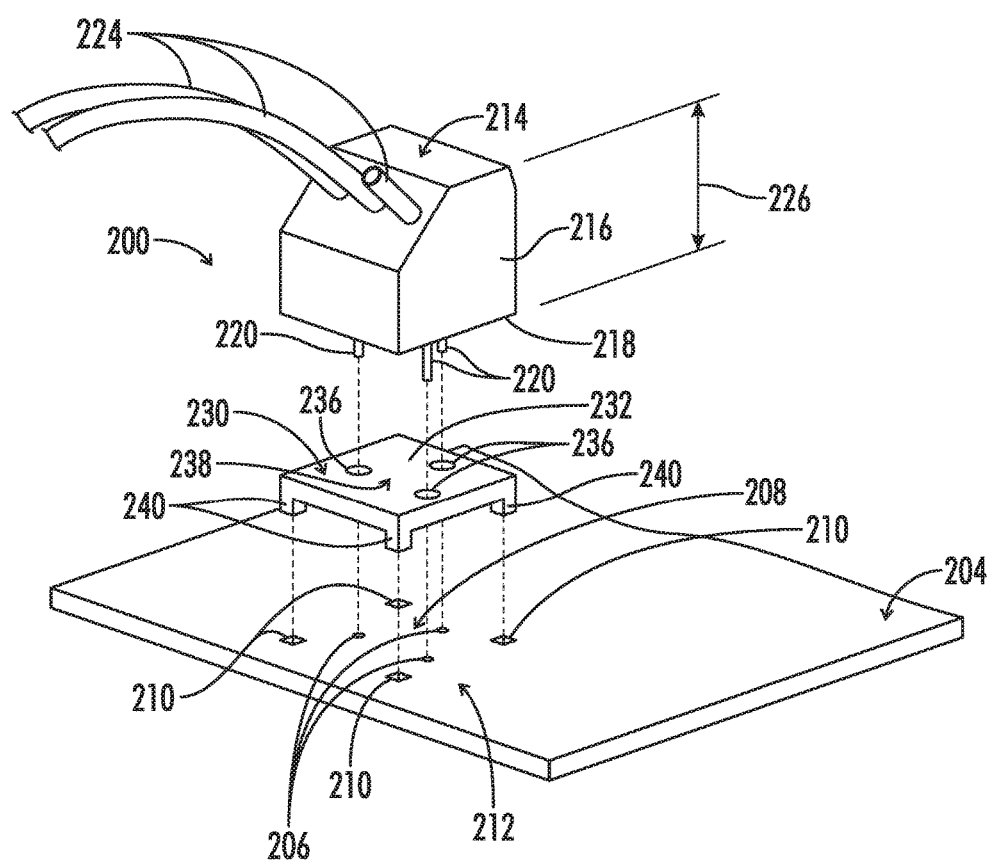
FIG. 4 illustrates an exploded perspective view of the connector assembly of FIG. 3.

A first embodiment of a connector assembly 200 is illustrated in FIGS. 2-4. The connector assembly 200 is configured to suppress electromagnetic interference (EMI) generated by electronic circuitry 202 (shown in FIG. 2 only) on a printed circuit board (PCB) 204. Each embodiment of a connector assembly shares common elements as now discussed and later referred to.

As shown in FIG. 4, the connector assembly 200 includes a plurality of conductive through-holes (or conductive PCB through-holes) 206 extending through the PCB 204. The conductive through-holes 206 form a conductive through-hole pattern 208 on the PCB 204. In the illustrated embodiment, the conductive through-hole pattern 208 is triangular. The conductive through-holes 206 are electrically connected to the electronic circuitry 202. The PCB 204 further includes a plurality of non-conductive through-holes (or square leg holes) 210. The non-conductive through-holes 210 form a non-conductive through-holes pattern 212. The non-conductive through-holes 210 are not electrically connected to the electronic circuitry 202.

Figure 5:
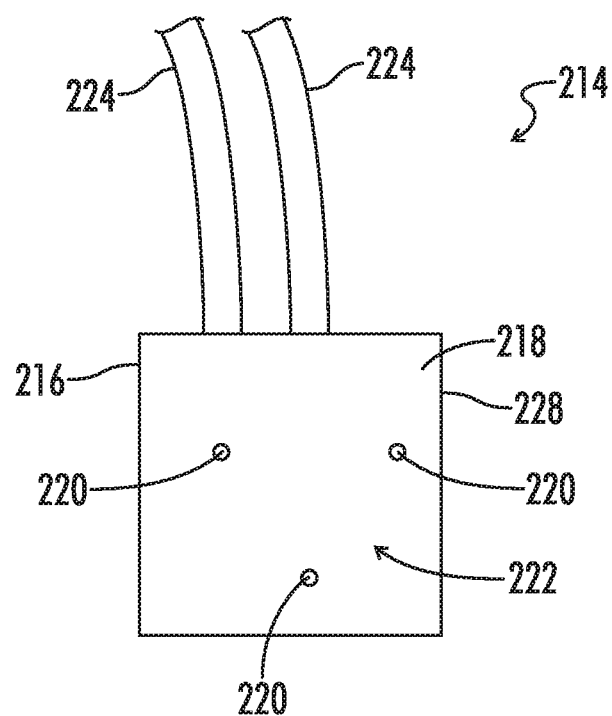
FIG. 5 illustrates a bottom plan view of a connector of the connector assembly of FIG. 3.

The connector assembly 200 further includes a connector 214. The connector 214 includes an outer perimeter wall 216 and a lower connector surface (or bottom connector surface) 218. The lower connector surface 218 is square, however it may be shaped differently in other embodiments (e.g., oblong rectangular, circular, or the like). As shown in FIG. 4, the connector 214 has a plurality of terminal pins (leads) 220. The terminal pins 220 extend perpendicularly from the lower connector surface 218 of the connector 214. The terminal pins 220 are configured to form a pin pattern 222 (FIG. 5) on the lower connector surface 218. The pin pattern 222 is configured to conform to the conductive through-hole pattern 208 on the PCB 204, and is triangular in the illustrated embodiment. The terminal pins 220 are configured to be inserted into the conductive through-holes 206. When the terminal pins 220 are inserted into the conductive through-holes 206, the terminal pins 220 are electrically connected to the electronic circuitry 202. The connector 214 further includes a plurality of conductors 224 extending therefrom. The conductors 224 are configured to be in electrical communication with the terminal pins 220. The connector 214 has a connector height 226 extending from the lower connector surface 216 vertically. The lower connector surface 218 of the connector 214 defines a connector profile 228 (shown in FIG. 5 only).

As shown in FIG. 2, the conductors 224 of a first connector 214 are coupled to a source of alternating current (AC) 250. As also shown in FIG. 2, the conductors 224 of a second connector 214 are coupled to a direct current (DC) load 260. In FIG. 2, only two of the three conductors 224 of each connector 214 are connected.

The connector assembly 200 further includes a magnetic wafer 230, as shown in FIGS. 2-4, 6A, and 6B. The magnetic wafer 230 is configured to suppress EMI noise generated by the electronic circuitry 202 on the PCB 204. The magnetic wafer 230 includes an upper wafer surface 232 (shown in FIGS. 4 and 6A) and a lower wafer surface 234 (shown in 6B). In the illustrated embodiment, the perimeter of the upper wafer surface 232 generally matches the connector profile 228. In other embodiments, the perimeter of the upper wafer surface 232 may be larger, may be smaller, or may have a different shape with respect to the connector profile 228.

Figure 6A:
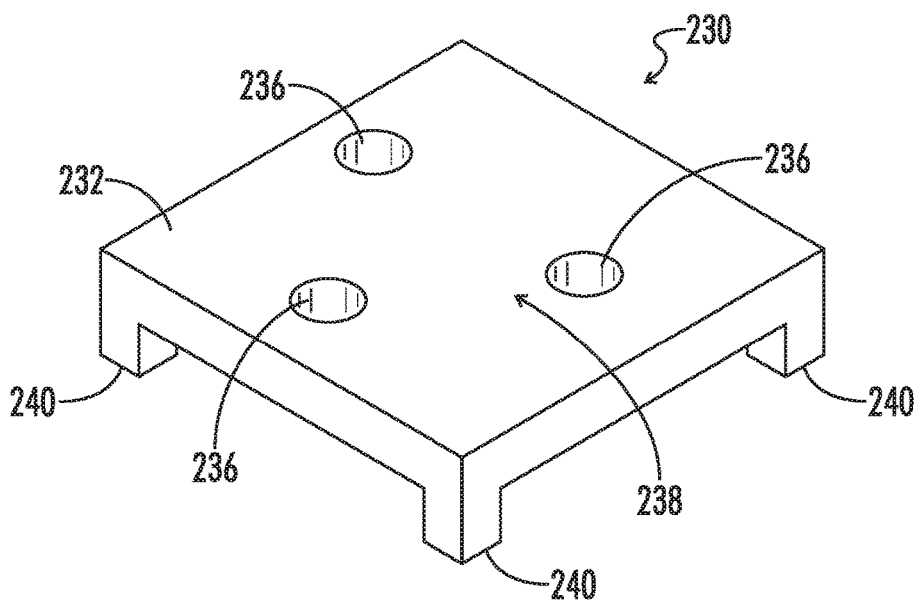
FIG. 6A illustrates a top perspective view of the magnetic wafer of FIG. 3.
Figure 6B:
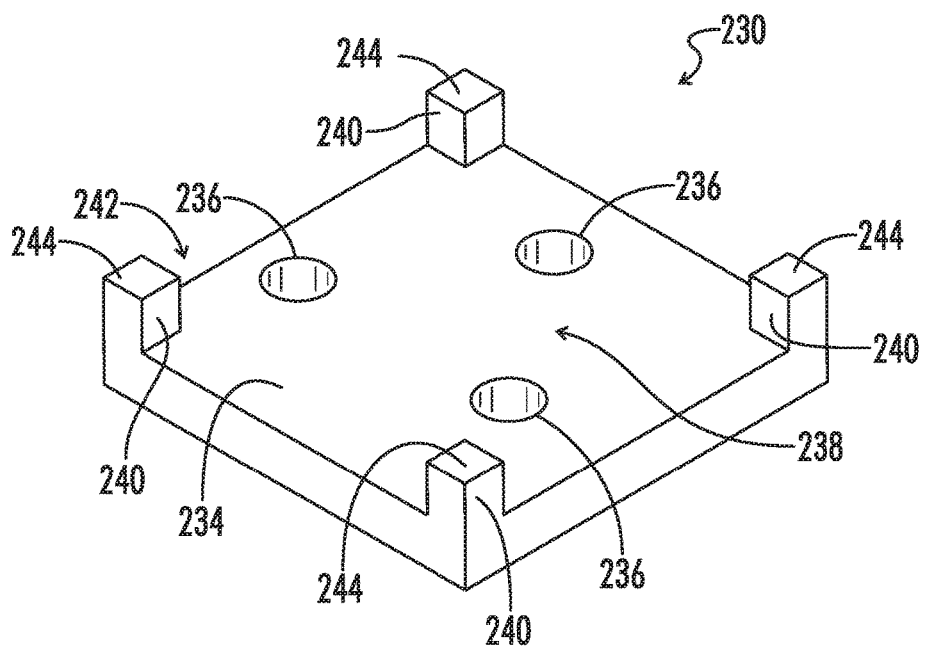
FIG. 6B illustrates a bottom perspective view of the magnetic wafer of FIG. 3.

As shown in FIGS. 4, 6A, and 6B, the magnetic wafer 230 further includes a plurality of wafer through-holes 236 extending between the upper wafer surface 232 and the lower wafer surface 234. The wafer through-holes 236 form a wafer hole pattern 238. The magnetic wafer 230 is positionable between the PCB 204 and the lower connector surface 218. The wafer hole pattern 238 is configured to align with both the conductive through-hole pattern 208 and the pin pattern 222 as shown in FIG. 4. In the illustrated embodiment, the wafer hole pattern 238 is triangular.

The magnetic wafer 230 further includes a plurality of wafer legs 240 extending from the lower wafer surface 234, as shown in FIGS. 4, 6A, and 6B. The wafer legs 240 form a wafer leg pattern 242 (FIG. 6B). The wafer leg pattern 242 conforms to the non-conductive through-hole pattern 212 (FIG. 4) on the PCB 204. The wafer leg pattern 242 aligns with the non-conductive through-hole pattern 212 (FIG. 4). The wafer legs 238 are configured to engage the plurality of non-conductive through-holes 210. The wafer through-holes 236 are aligned with the conductive through-holes 206 when the wafer legs 238 are engaged with the non-conductive through-holes 210 of the PCB 204.

As shown in FIG. 6B, each wafer leg 240 has a square leg profile 244. The profile of each of the non-conductive through-holes 210 is also square. Each wafer leg 240 is configured to fit snugly in a respective one of the non-conductive through-holes 210. As such, in the preferred embodiment, the leg profile 244 and non-conductive through-holes match. In other embodiments (not shown), the leg profile 244 of each of the wafer legs 240 and the non-conductive through-holes may be shaped differently (e.g., circular or oblong rectangular).

In the first embodiment, the magnetic wafer 230 is square with four corners. The plurality of wafer legs 240 includes four wafer legs, with one leg positioned at each corner of the magnetic wafer 230. Although the magnetic wafer 230 is shown with four wafer legs, two wafer legs are sufficient to keep the magnetic wafer 230 immobile when engaged with the non-conductive through-holes 210 of the PCB 204.

Figure 7:
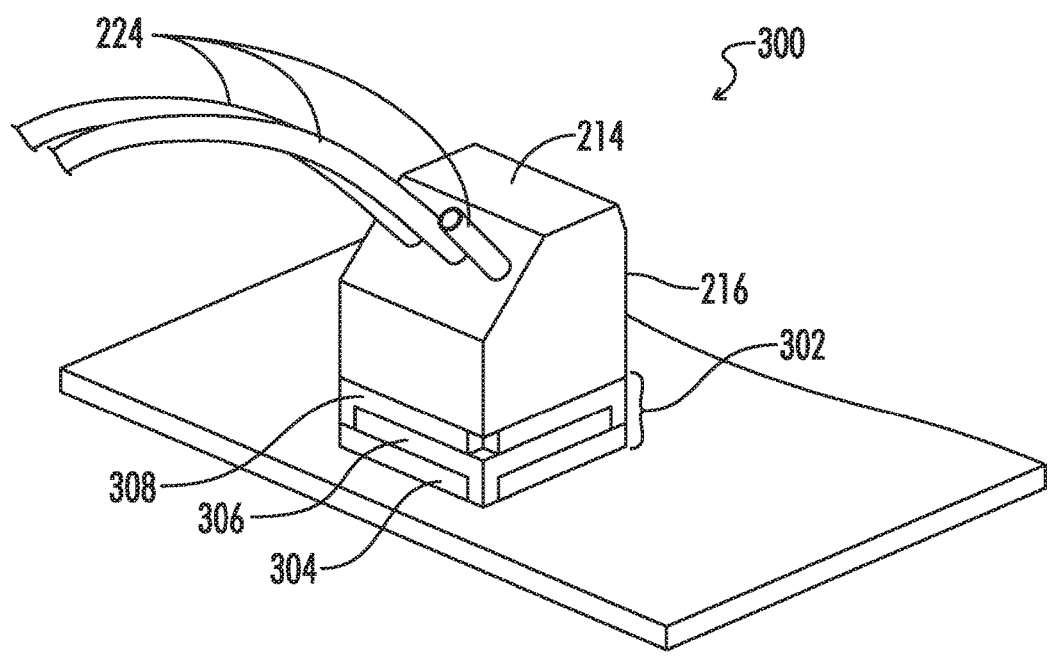
FIG. 7 illustrates a perspective view of a connector assembly having a plurality of stackable magnetic wafers in accordance with the present disclosure.
Figure 8:
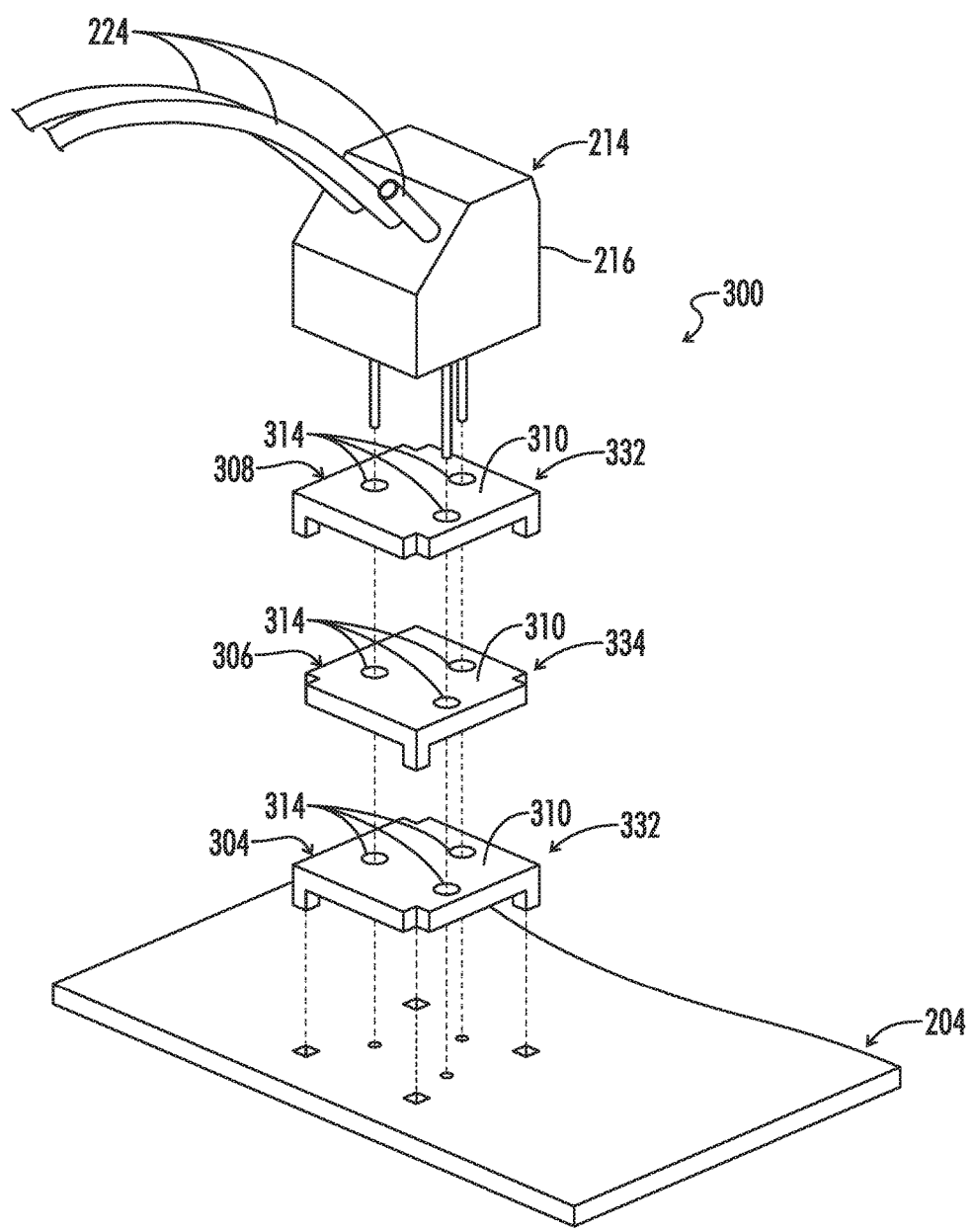
FIG. 8 illustrates an exploded perspective view of the connector assembly of FIG. 7.

A second embodiment of a connector assembly 300 is illustrated in FIGS. 7 and 8. The connector assembly 300 includes the PCB 204 and the connector 214 described above. The connector assembly 300 is configured to suppress electromagnetic interference (EMI) generated by the electronic circuitry 202 on the PCB 204. The second embodiment improves the EMI noise suppression capabilities of the first embodiment by adding at least one additional magnetic wafer similar to the magnetic wafer 230 of the connector assembly 200. In the illustrated embodiment, two additional magnetic wafers are added to form a three-layer stack 302 of magnetic wafers.

Figure 9A:
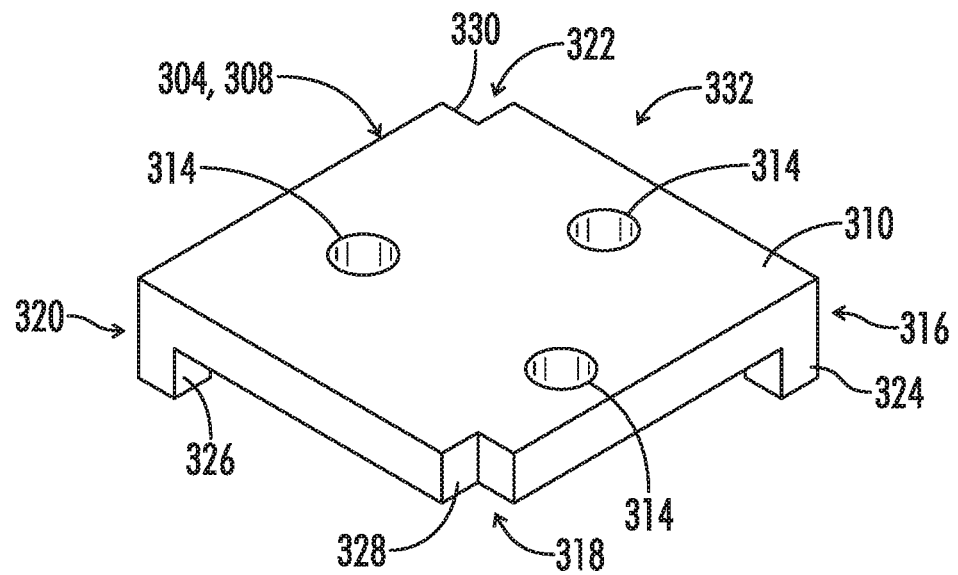
FIG. 9A illustrates a top perspective view of one wafer of the plurality of stackable magnetic wafers of FIG. 7 having a first wafer configuration.
Figure 9B:
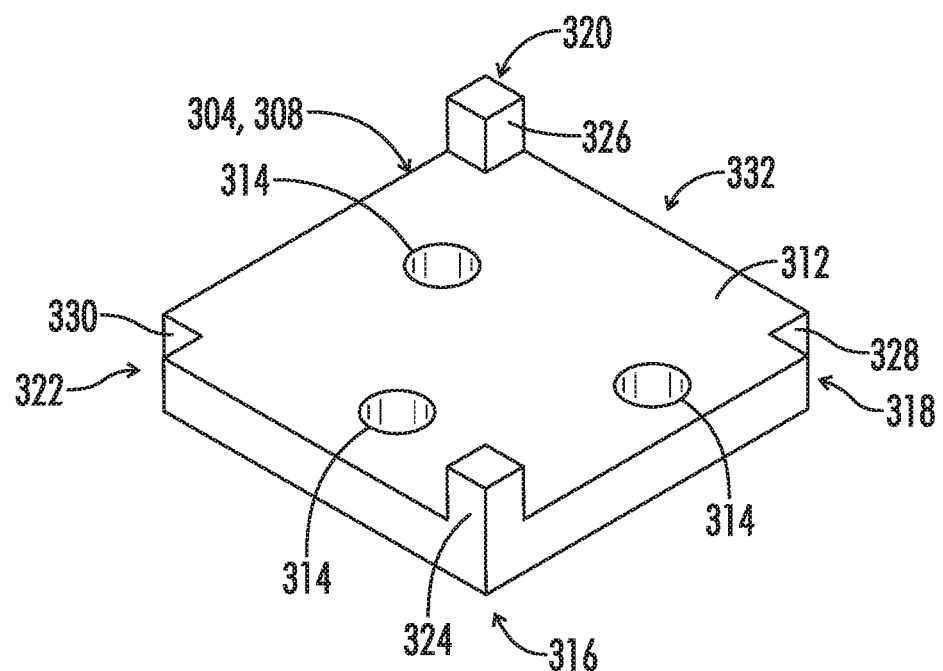
FIG. 9B illustrates a bottom perspective view of one wafer of the plurality of stackable magnetic wafers of FIG. 7 having a first wafer configuration.

The stack 302 of the connector assembly 300 includes a first stackable wafer 304, a second stackable wafer 306, and a third stackable wafer 308. The second stackable wafer 306 is positioned above the first stackable wafer 304 and the third stackable wafer 308 is positioned above the second stackable wafer 306. The stackable wafers 304, 306, 308 are positioned between the connector 214 and the PCB 204, with the first stackable wafer proximate the PCB 204. Each of the stackable wafers 304, 306, 308 includes an upper wafer surface 310 (FIGS. 8, 9A, and 10A) and a lower wafer surface 312 (FIGS. 9B and 10B). As shown in FIGS. 8-10B, each stackable wafer 302 further includes a plurality of wafer through-holes 314 extending between the upper wafer surface 310 and the lower wafer surface 312.

Each of the stackable wafers 304, 306, 308 is generally square (as seen, for example, in FIGS. 9A-10B) and includes a first corner 316, a second corner 318, a third corner 320, and a fourth corner 322. The first corner 316 is positioned diagonally across from the third corner 320. The second corner 318 is positioned diagonally across from the fourth corner 322.

As shown in the illustrated embodiment, each of the stackable wafers 304, 306, 308 includes a first wafer leg 324 and a second wafer leg 326. Each of the first and second wafer legs 324, 326 extends perpendicularly from the lower wafer surface 312 at diagonally opposite corners. Each of the stackable wafers 304, 306, 308 further includes a first wafer leg cut-out 328 and a second wafer leg cut-out 330. Each of the first and second wafer leg cut-outs 328, 330 extend between the upper wafer surface 310 and the lower wafer surface 312. The first and second wafer leg cut-outs 328, 330 are positioned at diagonally opposite corners that are 90 degrees from the corners of the first and second wafer legs 324, 326. The first and second wafer legs 324, 326 and the first and second wafer leg cut-outs 328, 330 of adjacent stackable wafers 304, 306, 308 interact to hold the wafer through-holes 314 in alignment.

Figure 10A:
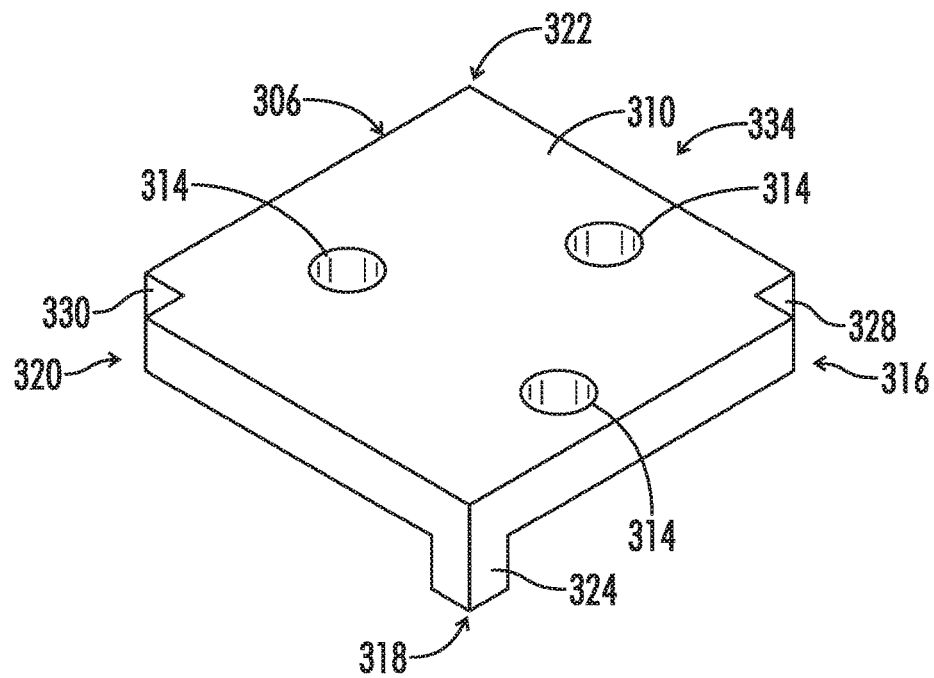
FIG. 10A illustrates a top perspective view of one wafer of the plurality of stackable magnetic wafers of FIG. 7 having a second wafer configuration.
Figure 10B:
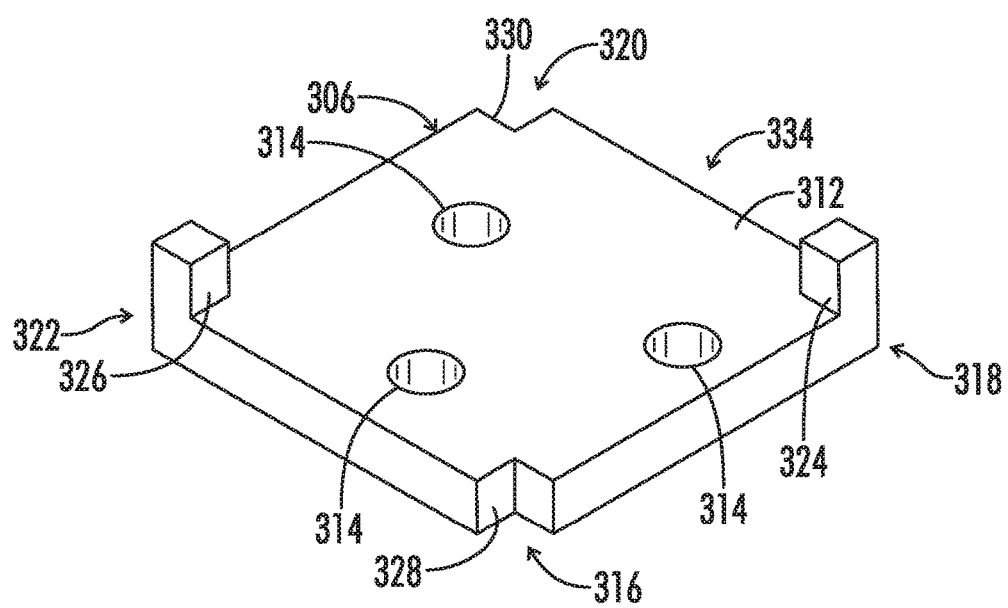
FIG. 10B illustrates a bottom perspective view of one wafer of the plurality of stackable magnetic wafers of FIG. 7 having a second wafer configuration.

The wafer legs 324, 326 and wafer leg cut-outs 328, 330 of each of the stackable wafers 304, 306, 308 may either be configured according to a first wafer configuration 332 (FIGS. 9A and 9B) or a second wafer configuration 334 (FIGS. 10A and 10B). As shown in FIG. 8, the first and third stackable wafers 304, 308 are configured according to the first wafer configuration 332; and the second wafer 306 is configured according to the second wafer configuration 334. In each of the first and second wafer configurations 332, 334, the wafer through-holes 314 are oriented the same relative to the first, second, third, and fourth corners 316, 318, 320, 322.

The first wafer configuration 332 includes the first wafer leg 324 positioned at the first corner 316 and the second wafer leg 326 positioned at the third corner 320. The first wafer configuration 332 further includes the first wafer leg cut-out 328 positioned at the second corner 318 and the second wafer leg cut-out 330 positioned at the fourth corner 322. The second wafer configuration 332 includes the first wafer leg 324 positioned at the second corner 318 and the second wafer leg 326 positioned at the fourth corner 322. The second wafer configuration 332 further includes the first wafer leg cut-out 328 positioned at the first corner 316 and the second wafer leg cut-out 330 positioned at the third corner 320.

In the illustrated embodiment for example, the first and second wafer legs 324, 326 of the first stackable wafer 304 engage the non-conductive through-holes 210 of the PCB 204. The first and second wafer legs 324, 326 of the second stackable wafer 306 engage the first and second wafer leg cut-outs 328, 330 of the first stackable wafer 304. The first and second wafer legs 324, 326 of the third stackable wafer 308 engage the first and second wafer leg cut-outs 328, 330 of the second stackable wafer 306. The connector 214 is positioned on the upper wafer surface 310 of the third stackable wafer 308. The lengths of the terminal pins 220 of the connector 214 may be cut to fit. As such, in the second embodiment, the terminal pins 220 are longer than in the first embodiment in order to extend fully through aligned wafer through-holes 310 of the first, second, and third wafers 304, 306, 308 and engage the conductive through-holes 206 of the PCB 204.

To enable the wafer through-holes 314 of adjacent stackable wafers 304, 406, 308 to align and to enable the wafer legs 324, 326 and wafer leg cut-outs 328, 330 to align, the first and second wafer configurations 332, 334 alternate within the stack 304, which causes the first, second, third, and fourth corners 312, 324, 326, 328 to align when stacked. Alternation is used in the illustrated embodiment because the wafer through-holes are positioned asymmetrically on the wafer 302 to conform to the pin pattern 222 of the connector 214.

Figure 11:
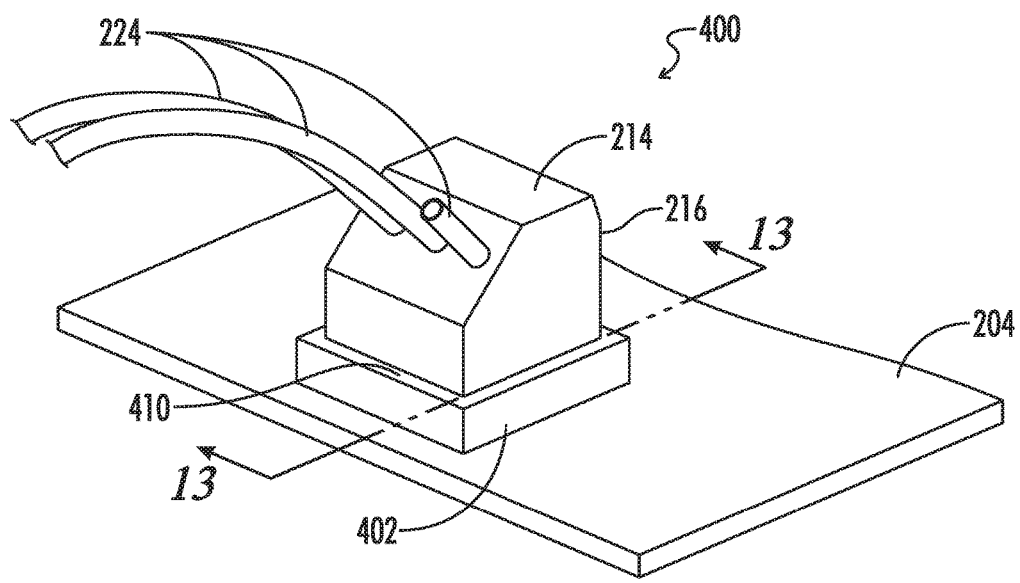
FIG. 11 illustrates a perspective view of a connector assembly having a magnetic wafer cup in accordance with the present disclosure.
Figure 13:
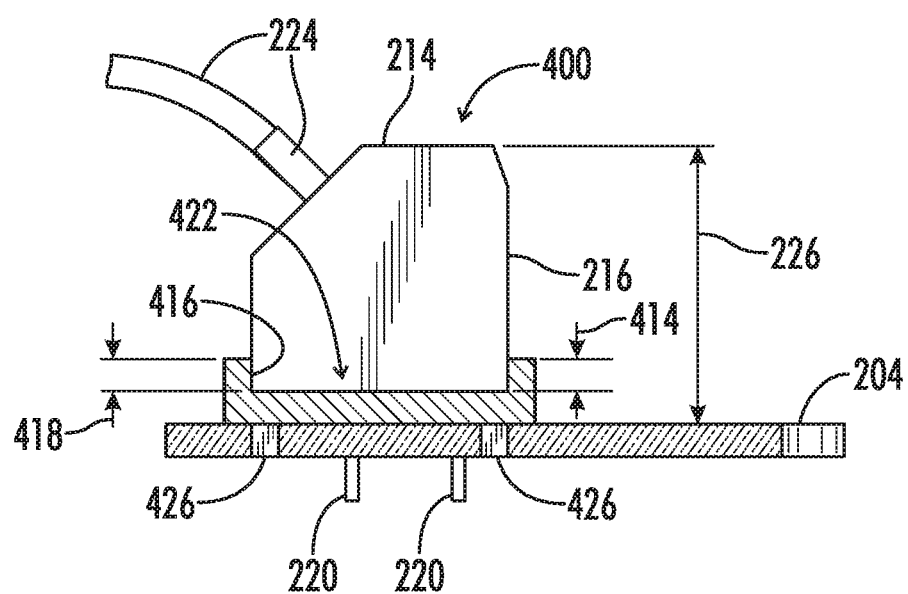
FIG. 13 illustrates a cross-sectional right side elevation view of the connector assembly of FIG. 11.
Figure 14A:
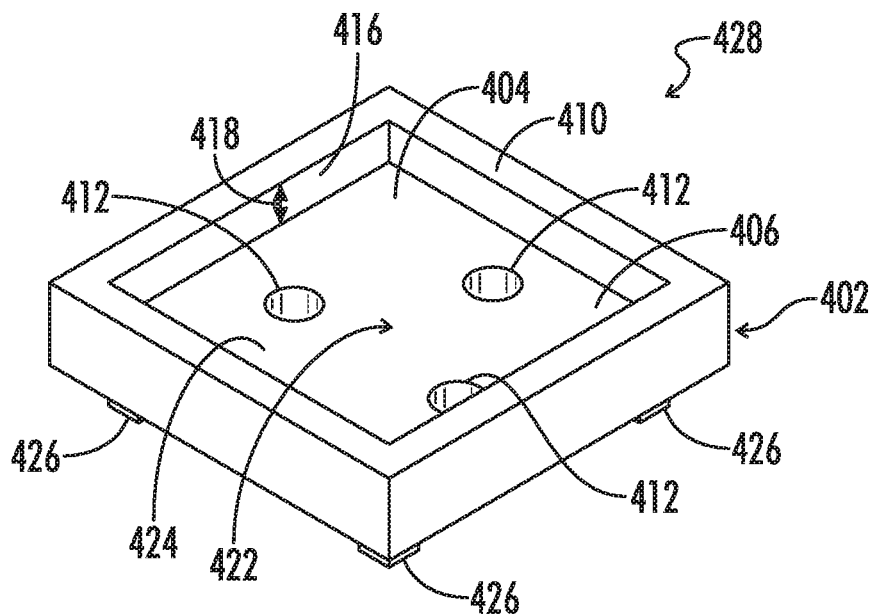
FIG. 14A illustrates a top perspective view of the magnetic wafer cup of FIG. 11 having four wafer legs.
Figure 14B:
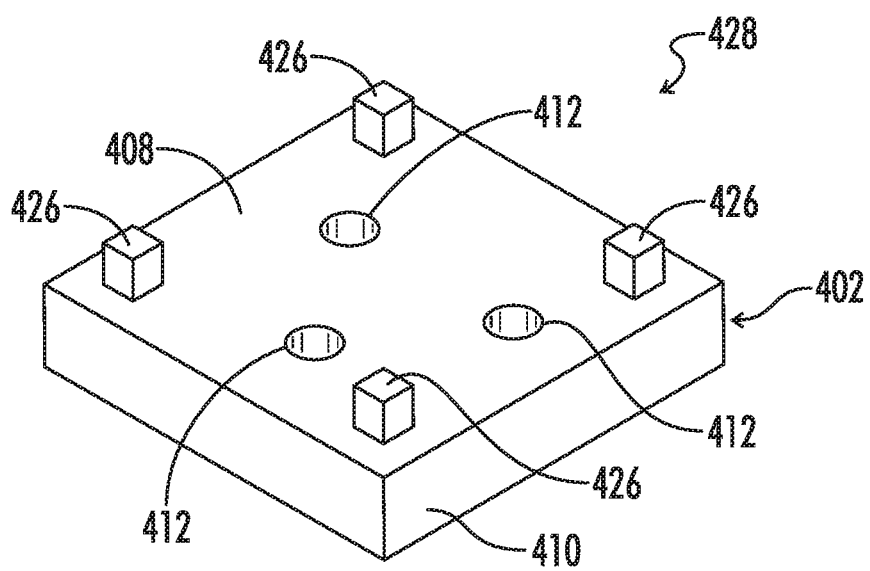
FIG. 14B illustrates a bottom perspective view of the magnetic wafer cup of FIG. 11 having four wafer legs.

A third embodiment of a connector assembly 400 is illustrated in FIGS. 11 and 13. The connector assembly 400 includes the PCB 204 and the connector 214 described above. The connector assembly 400 is configured to suppress electromagnetic interference (EMI) generated by the electronic circuitry 202 on the PCB 204. The third embodiment improves the EMI noise suppression capabilities of the first embodiment by adding a collar to the upper wafer surface 232. The collar surrounds at least a lower portion of the connector 214.

A magnetic cup wafer 402 of the connector assembly 400 is shown in FIGS. 2 and 10-12. The magnetic cup wafer 402 is positioned between the PCB 204 and the connector 214.

The magnetic cup wafer 402 includes a main wafer body 404, which is similar to the magnetic wafer 230 and one of the stackable wafers 304, 306, 308. The magnetic wafer body 404 has an upper wafer surface 406 and a lower wafer surface 408. Contiguous walls 410 extend vertically from the main wafer body 404 to form a boundary around the upper wafer surface 406. The main wafer body 404 has a plurality of wafer holes 412, which extend between the upper wafer surface 406 and the lower wafer surface 408. The wafer holes 412 are configured to align with the terminal pins 220 and align with the conductive through-holes 206 of the PCB 204. The contiguous walls 410 are configured to align the terminal pins 220 of the connector 214 with the wafer holes 412 when the connector 214 is inserted within the boundary formed by the walls 410. The lower wafer surface 408 is configured to contact the PCB 204. The upper wafer surface 406 is configured to contact the lower connector surface 218. The contiguous walls 410 surround a lower portion 414 of the connector height 226 (FIG. 13) defined around the outer perimeter wall 216 of the connector 214.

The contiguous walls 410 of the wafer cup 402 have internal wall surfaces 416. As shown in FIG. 13, the internal wall surfaces 416 are configured to contact the outer perimeter wall 216 of the connector 214. In the illustrated embodiment, the internal wall surfaces 416 have an internal wall height 418. The internal wall height 418 is less than the connector height 226. In other embodiments, the internal wall height 418 may be greater.

The main body wafer 404 includes a wafer profile 420. In the illustrated embodiment, the wafer profile 420 is square. In other embodiments, the wafer profile 420 may be shaped differently (e.g., oblong rectangular, circular, or the like). The wafer profile 420 shape generally matches the connector profile 228.

The interior wall surfaces 416 in combination with the upper wafer surface 406 define a cavity 422, which has a cavity profile 424. The cavity profile 424 matches the connector profile 228. In the illustrated embodiment, the cavity profile 424 is square, however it can be shaped differently as previously stated.

Figure 12:
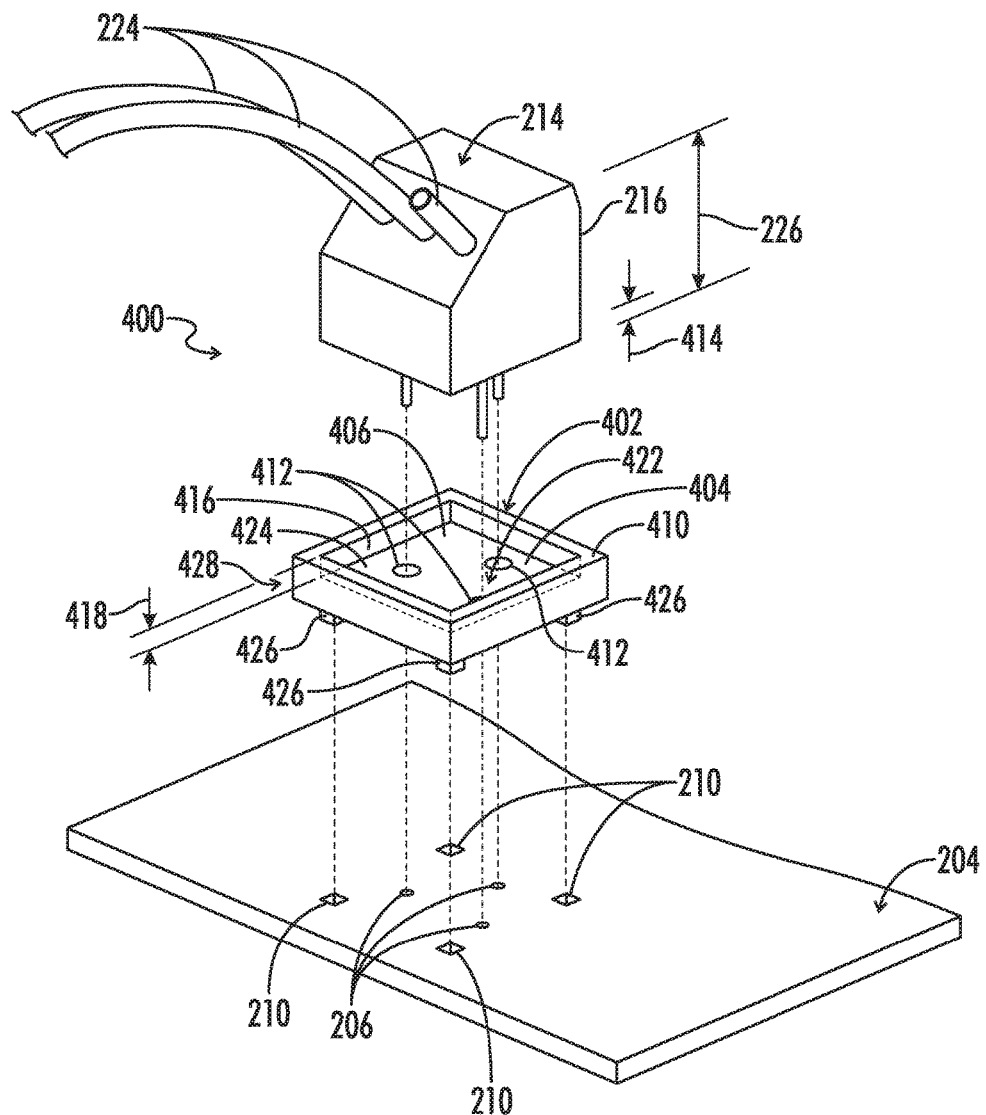
FIG. 12 illustrates an exploded perspective view of the connector assembly of FIG. 11.
Figure 15A:
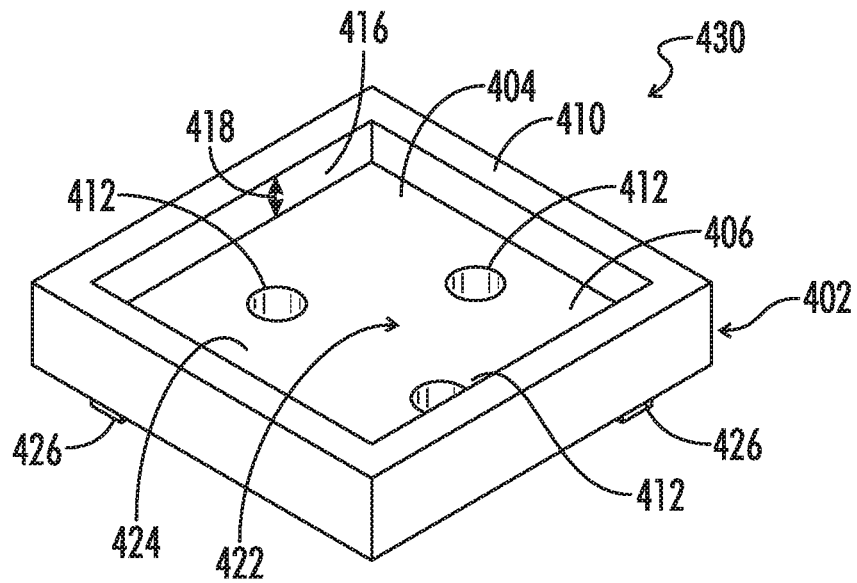
FIG. 15A illustrates a top perspective view of the magnetic wafer cup of FIG. 11 having two wafer legs positioned at opposite corners.
Figure 15B:
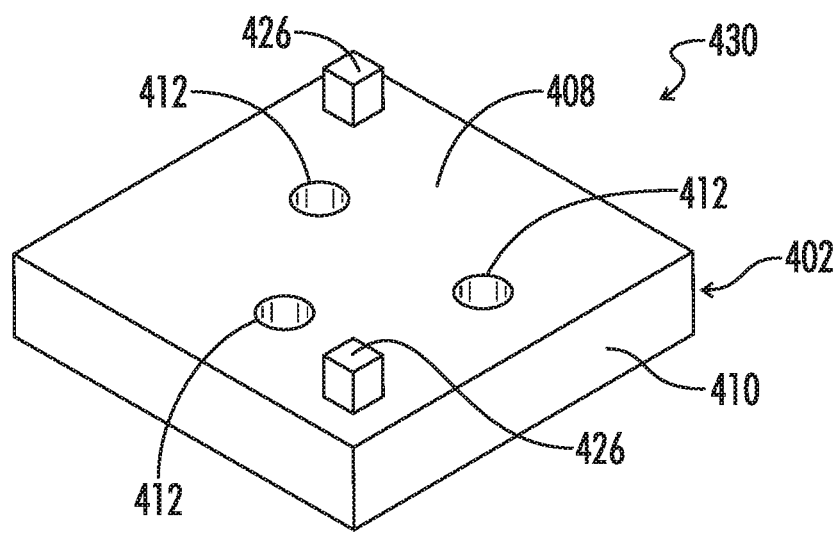
FIG. 15B illustrates a bottom perspective view of the magnetic wafer cup of FIG. 11 having two wafer legs positioned at opposite corners.

As shown in FIGS. 12-15B, the magnetic wafer cup 402 of the connector assembly 400 includes a plurality of wafer legs 426. As shown in FIGS. 12, 14A, and 14B, the wafer legs 426 are arranged according to a first wafer leg configuration 428 that includes four wafer legs 426. The wafer legs 426 of the first wafer leg configuration 428 align with the non-conductive through-holes 210 of the PCB 204. The first wafer leg configuration 428 is consistent with the wafer leg pattern 238 of the first embodiment of the connector assembly 200. As shown in FIGS. 15A and 15B, the wafer legs 426 are arranged according to a second wafer leg configuration 430 that includes two wafer legs 426. The second wafer leg configuration 430 has the wafer legs 426 positioned consistently with the first wafer configuration 332 of the second embodiment of the connector assembly 300. In other embodiments of the second wafer leg configuration 430 (not shown), the wafer legs 426 may be positioned consistently with the second wafer configuration 334 of the second embodiment of the connector assembly 300.

Figure 16A:
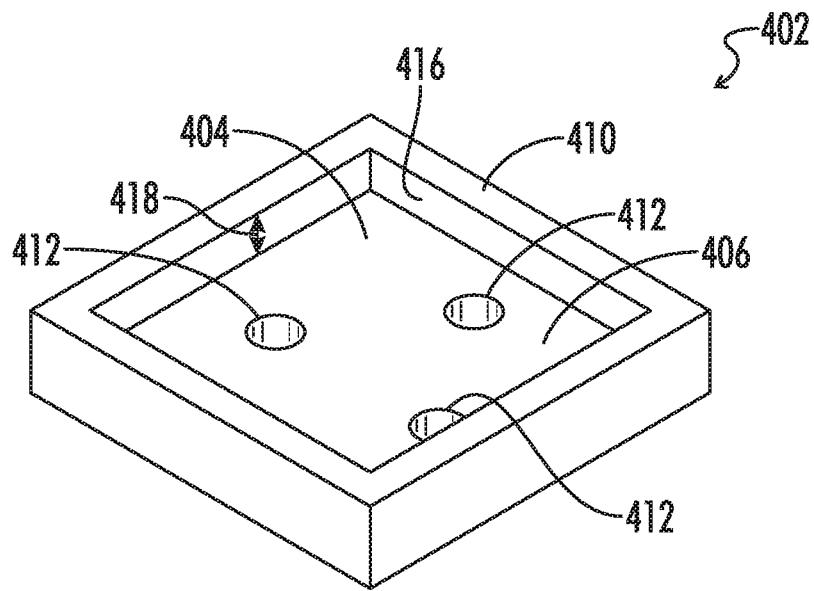
FIG. 16A illustrates a top perspective view of the magnetic wafer cup of FIG. 11 having no wafer legs.
Figure 16B:
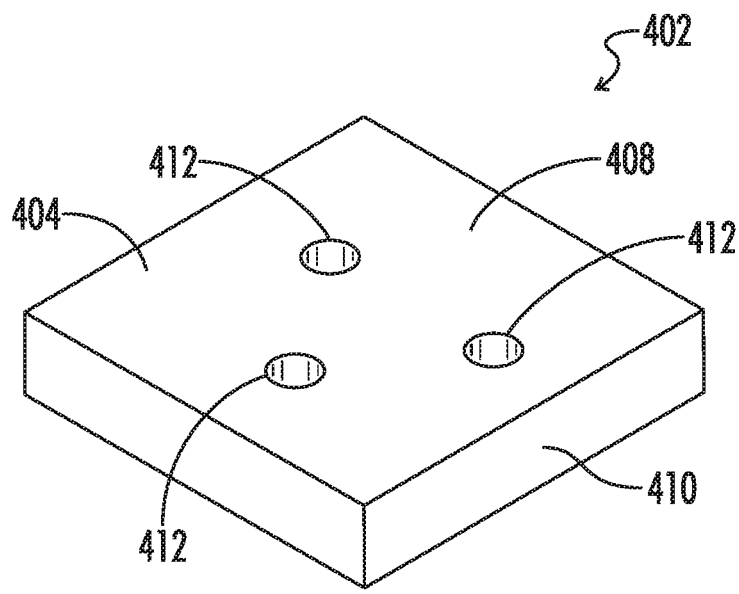
FIG. 16B illustrates a bottom perspective view of the magnetic wafer cup of FIG. 11 having no wafer legs.
Figure 17:
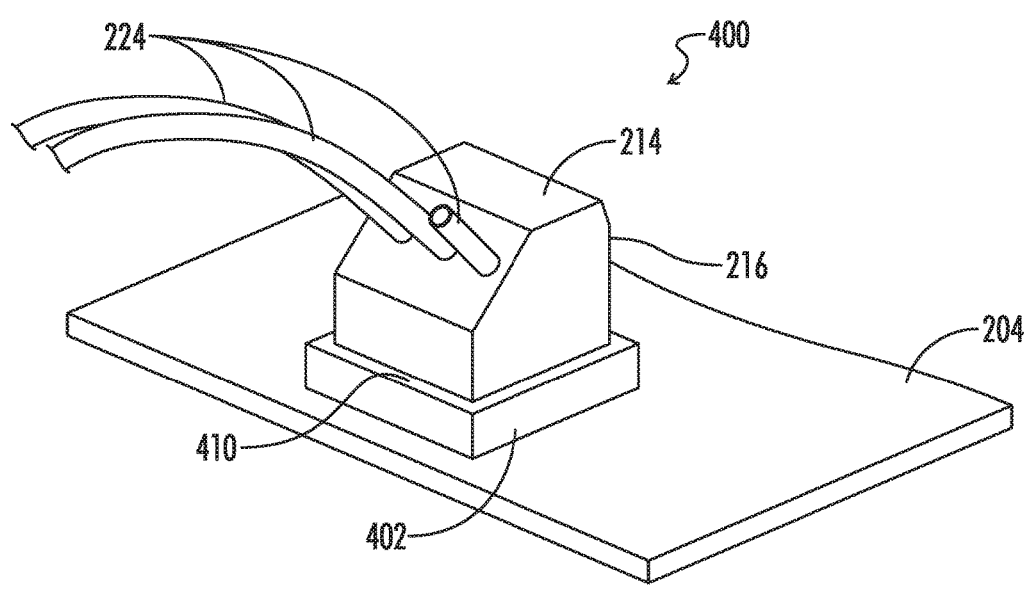
FIG. 17 illustrates a perspective view of the connector assembly of FIG. 11 having no wafer legs.
Figure 18:
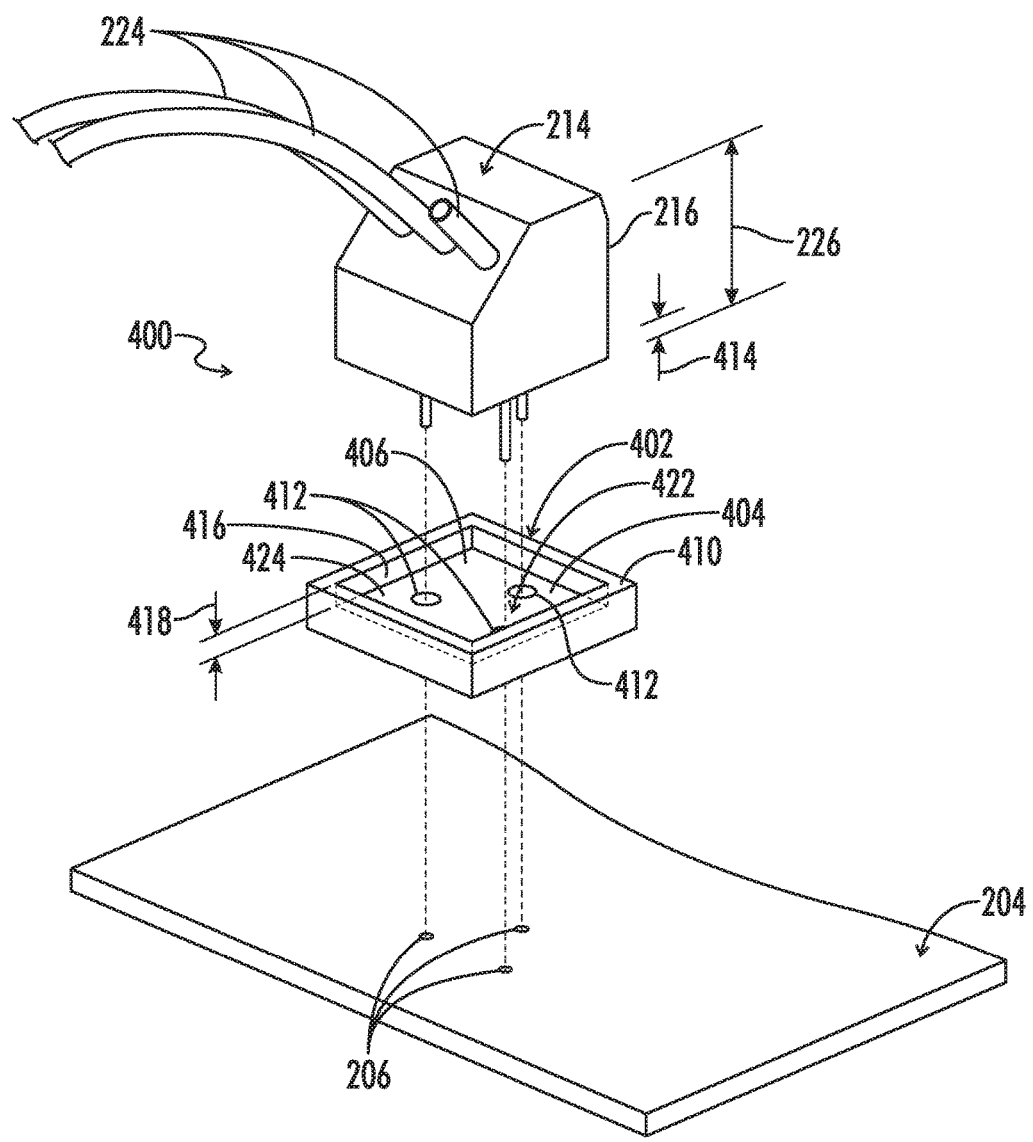
FIG. 18 illustrates an exploded perspective view of the connector assembly of FIG. 17.

As shown in FIGS. 16-18, the magnetic cup wafer 402 does not include wafer legs 428 and may be stabilized and held to the board using the terminal pins 220 of the connector 214. The PCB 204 in FIG. 18 does not include non-conductive through-holes 210 because there are no wafer legs 428 to receive.

The wafer legs 426 of both the first and second wafer leg configurations 428, 430 are configured to be able to directly engage non-conductive through-holes 210 of the PCB 204.

Figure 19:
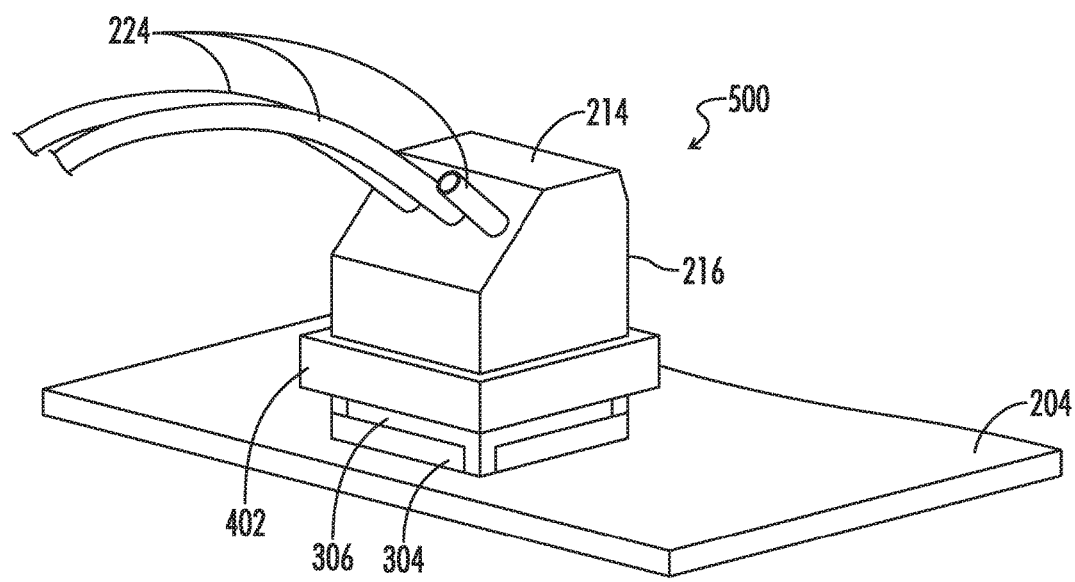
FIG. 19 illustrates a perspective view of a connector assembly having a magnetic wafer cup and a plurality of stackable magnet wafers in accordance with the present disclosure.
Figure 20:
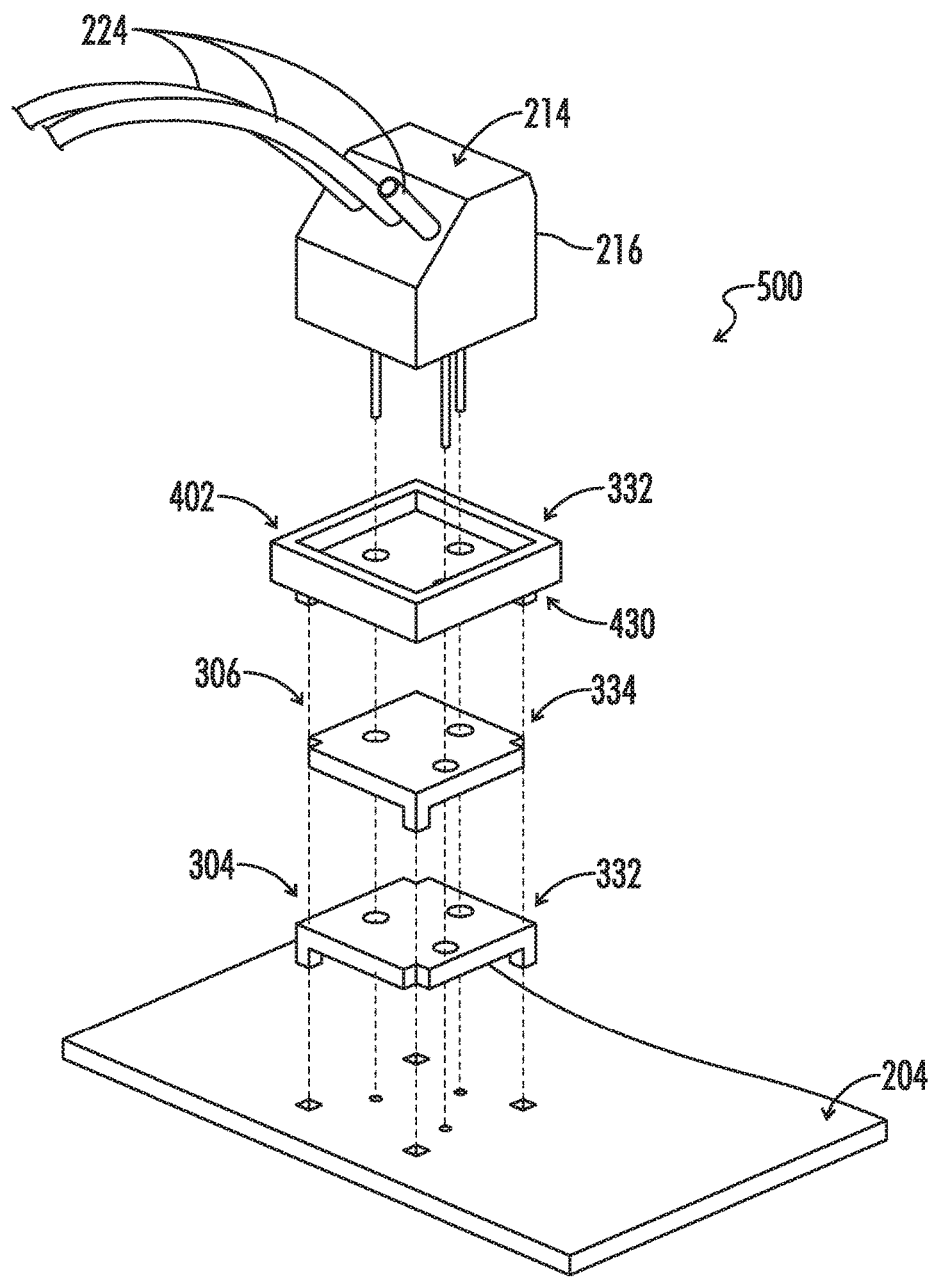
FIG. 20 illustrates an exploded perspective view of the connector assembly of FIG. 19.

The fourth embodiment of a connector assembly 500 shown in FIGS. 19 and 20 incorporates elements from both the second and third embodiments of the connector assemblies 300, 400. The connector assembly 500 includes the PCB 204 and the connector 214 described above. The connector assembly 500 is configured to suppress electromagnetic interference (EMI) generated by the electronic circuitry 202 on the PCB 204. The fourth embodiment modifies the second and third embodiments to further improve the EMI noise suppression capabilities by including the magnetic wafer cup 402 and the first and second stackable wafers 304, 306 to increase the inductance of the connector assembly 500.

The wafer legs 426 of magnetic wafer cup 402 in the fourth embodiment 500 are configured in accordance with the second wafer leg configuration 430 of FIGS. 15A and 15B. As shown in FIGS. 19 and 20, the first wafer 304 and second stackable wafer 306 of the connector assembly 300 are arranged between the magnetic wafer cup 402 and the PCB 204. The magnetic wafer cup 402 replaces the third stackable wafer 308 of FIGS. 11 and 12. The wafer legs of the magnetic wafer cup 402 engage the first and second wafer leg cut-outs 334, 336 of the second stackable wafer 306. The first and second wafer legs 324, 326 of the second stackable wafer 306 engage the first and second wafer leg cut-outs 328, 330 of the first stackable wafer 304. The first and second wafer legs 330, 332 of the first stackable wafer 304 engage the non-conductive through-holes 210 of the PCB 204.

The connector assembly 500 is configured the same as or similar to the connector assembly 300 of the second embodiment, except the third stackable wafer 308 is replaced with the magnetic wafer cup 402 having the second wafer leg configuration 430 (i.e., two wafer legs).

Since the first and second wafer configurations 332, 334 alternate as previously stated in the second embodiment, the wafer legs 426 of the magnetic cup wafer 402 may conform to either the first wafer configuration 322 or the second wafer configuration 334. As shown in the illustrated fourth embodiment, the wafer legs 426 of the magnetic wafer cup 402 are arranged according to the first wafer configuration 332. The first stackable wafer 304 is also configured according to the first wafer configuration 332 and the second stackable wafer 306 is configured according to the second wafer configuration 334.

Thus, although there have been described particular embodiments of the present invention of a new and useful "Ferrite Wafer and Connector Assembly for EMI Noise Suppression on a Printed Circuit Board," it is not intended that such references be construed as limitations upon the scope of this invention except as set forth in the following claims.

What is claimed is:

1. A connector assembly for suppressing electromagnetic interference (EMI) generated by electronic circuitry on a printed circuit board (PCB), the connector assembly comprising:

a plurality of conductive through-holes forming a conductive through-hole pattern on the PCB;

a connector having an outer perimeter wall, a lower connector surface, and a connector height extending vertically from the lower connector surface, the connector including a plurality of terminal pins configured to form a pin pattern conforming to the conductive through-hole pattern of the conductive through-holes on the PCB, the plurality of terminal pins engageable with the plurality of conductive through-holes; and a magnetic wafer cup coupleable between the PCB and the lower connector surface, the magnetic wafer cup having a main wafer body, a upper wafer surface, a lower wafer surface, and contiguous walls extending vertically from the main wafer body and surrounding the upper wafer surface, the main wafer body having a plurality of wafer holes configured to align with the terminal pins and the conductive through-holes, the lower wafer surface configured to contact the PCB, the upper wafer surface configured to contact the lower connector surface, the contiguous walls configured to surround the outer perimeter wall of the connector by a vertical portion of the connector height.

2. The connector assembly of claim 1, wherein the connector includes a plurality of conductors attached in electrical communication with the terminal pins.

3. The connector assembly of claim 1, wherein the contiguous walls of the wafer cup include internal wall surfaces configured to contact the outer perimeter walls of the connector.

4. The connector assembly of claim 3, wherein:
the internal wall surfaces of the wafer cup have an internal wall height;
the portion of the connector height is equal to the internal wall height; and
the internal wall height is less than the connector height.

5. The connector assembly of claim 1, wherein the connector and the main wafer body are both rectangular shaped.

6. The connector assembly of claim 1, wherein the connector has a connector profile defined by the lower connector surface, and wherein the main wafer body has a wafer profile matching the connector profile.

7. The connector assembly of claim 6, wherein the contiguous walls in combination with the upper wafer surface define a cavity having a cavity profile matching the connector profile.

8. The connector assembly of claim 1, wherein the contiguous walls align the terminal pins of the connector with the wafer holes of magnetic wafer cup.

9. A printed circuit board (PCB) connector assembly for suppressing electromagnetic interference (EMI) generated by electronic circuitry on the PCB, the PCB connector assembly comprising:
a plurality of conductive PCB through-holes on the PCB;
a plurality of non-conductive PCB through-holes on the PCB;
a connector having a plurality of terminal leads extending from a bottom connector surface, the plurality of terminal leads positionable through the plurality of conductive PCB through-holes, the connector coupled to a plurality of conductors in electrical communication with the terminal leads; and
a magnetic wafer including an upper wafer surface, a lower wafer surface and a plurality of wafer through-holes extending between the upper and lower wafer surfaces, the magnetic wafer positionable between the PCB and the lower surface of the connector, the magnetic wafer further including a plurality of wafer legs extending from the lower wafer surface, the plurality of wafer legs configured to engage the plurality of non-conductive PCB through-holes.

10. The PCB connector assembly of claim 9, wherein each wafer leg has a square leg profile, and wherein each non-conductive PCB through-hole is square.

11. The PCB connector assembly of claim 9, wherein the magnetic wafer is square with four corners, and wherein the plurality of wafer legs includes four legs with one leg positioned at each of the four corners.

12. The PCB connector assembly of claim 9, wherein the plurality of wafer legs engaged with the plurality of non-conductive PCB through-holes are configured to align the wafer through-holes with the plurality of conductive PCB through-holes.

13. A connector assembly for suppressing electromagnetic interference (EMI) from electronic circuitry on a printed circuit board (PCB), the connector assembly comprising:
a plurality of conductive through-holes on the PCB electronically connected to the electronic circuitry;
a connector having a plurality of terminal pins extending perpendicularly therefrom, the plurality of terminal pins configured to pass through the plurality of conductive through-holes and to electrically engage with the conductive through-holes and thereby electrically connect to the electronic circuitry; and
a plurality of stackable magnetic wafers, each wafer having a lower wafer surface, an upper wafer surface, a plurality of wafer through-holes, at least one wafer leg extending from the lower wafer surface, and at least one wafer leg cut-out extending between the lower wafer surface and the upper wafer surface;
wherein the at least one wafer leg cutout of a first wafer is engaged by the at least one wafer leg of an adjacent second wafer to align the wafer through-holes of the first and second wafers; and
wherein the plurality of terminal pins are configured to extend fully through the aligned wafer through-holes of the first and second wafer and engage the conductive through-holes of the PCB.

14. The connector assembly of claim 13, wherein each wafer of the plurality of stackable magnetic wafers is generally square having a first corner, a second corner, a third corner, and a forth corner, the first and third corners positioned diagonally opposite.

15. The connector assembly of claim 14, wherein the at least one wafer leg of each stackable magnetic wafer includes a first wafer leg and a second wafer leg, each of the first and second wafer legs extending from diagonally opposite corners.

16. The connector assembly of claim 14, wherein the plurality of stackable wafers includes stackable wafers having a first wafer configuration and stackable wafers having a second wafer configuration.

17. The connector assembly of claim 16, wherein the plurality of stackable wafers are stacked by alternating between the first and second wafer configurations in order for the wafer through-holes to align.

18. The connector assembly of claim 16, wherein the first wafer configuration includes a first wafer leg and a second wafer leg positioned at the first and third wafer corners, respectively, the first wafer configuration further includes a first wafer leg cut-out and a second wafer leg cut-out positioned at the second and fourth wafer corners, respectively.

19. The connector assembly of claim 16, wherein the second wafer configuration includes a first wafer leg and a second wafer leg positioned at the second and fourth wafer corners, respectively, the second wafer configuration further includes a first wafer leg cut-out and a second wafer leg cut-out positioned at the first and third wafer corners, respectively.

20. The connector assembly of claim 13, wherein:
the PCB further includes a plurality of square leg through-holes; and
the at least one wafer leg of the first wafer is configured to engage at least one of the plurality of leg through-holes.

21. The connector assembly of claim 13, wherein:
the plurality of stackable wafers further includes a third wafer; and
the third wafer is stacked on top of the second wafer, the second wafer is tacked on top of the first wafer, the at least one wafer leg of the third wafer engaging the at least one wafer leg cutout of the second wafer to align the through-holes of the first, second and third wafers.

\* \* \* \* \*